United States Patent
Hwang

(10) Patent No.: US 8,729,568 B2
(45) Date of Patent: May 20, 2014

(54) LIGHT EMITTING DEVICE

(75) Inventor: Sung Min Hwang, Seoul (KR)

(73) Assignee: LG Innotek Co., Ltd., Seoul (KR)

(*) Notice: Subject to any disclaimer, the term of this patent is extended or adjusted under 35 U.S.C. 154(b) by 0 days.

(21) Appl. No.: 13/372,265

(22) Filed: Feb. 13, 2012

(65) Prior Publication Data

US 2012/0138995 A1 Jun. 7, 2012

(30) Foreign Application Priority Data

Jun. 13, 2011 (KR) .................. 10-2011-0056997

(51) Int. Cl.
*H01L 33/00* (2010.01)

(52) U.S. Cl.
USPC .................... 257/79; 257/E33.005

(58) Field of Classification Search
USPC .......... 257/87, 98, E33.005, E33.011
See application file for complete search history.

(56) References Cited

U.S. PATENT DOCUMENTS

| | | | |
|---|---|---|---|
| 6,255,129 B1* | 7/2001 | Lin ............................ | 438/26 |
| 7,709,845 B2* | 5/2010 | Ko et al. .................... | 257/79 |
| 2002/0001864 A1* | 1/2002 | Ishikawa et al. ........... | 438/22 |
| 2004/0099857 A1* | 5/2004 | Song et al. ................. | 257/12 |
| 2004/0185589 A1* | 9/2004 | Ishikawa et al. ........... | 438/47 |
| 2005/0082562 A1* | 4/2005 | Ou et al. .................... | 257/103 |
| 2006/0054919 A1* | 3/2006 | Matsuda et al. ........... | 257/103 |
| 2007/0102715 A1* | 5/2007 | Ko et al. .................... | 257/88 |
| 2007/0110112 A1* | 5/2007 | Sugiura ...................... | 372/43.01 |
| 2012/0098009 A1* | 4/2012 | Kim et al. .................. | 257/98 |

* cited by examiner

*Primary Examiner* — Cheung Lee
*Assistant Examiner* — Jeremy Joy
(74) *Attorney, Agent, or Firm* — Birch, Stewart, Kolasch & Birch, LLP

(57) ABSTRACT

A light emitting device includes a substrate, a first conductive type semiconductor layer disposed on the substrate, an active layer disposed on one part of the first conductive type semiconductor layer, a second conductive type semiconductor layer disposed on the active layer, a first electrode disposed on the second conductive type semiconductor layer, and a second electrode disposed on the other part of the first conductive type semiconductor layer, wherein a trench is formed at a portion of the second conductive type semiconductor layer, the active layer or the first conductive type semiconductor layer so that the trench is disposed under the first electrode.

20 Claims, 11 Drawing Sheets

LIGHT EMITTING DEVICE

CROSS REFERENCE TO RELATED APPLICATION

This application claims priority under 35 U.S.C. §119 to Korean Patent Application No. 10-2011-0056997, filed in Korea on Jun. 13, 2011, which is hereby incorporated in its entirety by reference as if fully set forth herein.

TECHNICAL FIELD

Embodiments relate to a light emitting device.

BACKGROUND

A light emitting device, such as a light emitting diode, using a group III-V or II-VI compound semiconductor material may emit light having various colors, such as red, green, blue and ultraviolet light, as the result of advances in thin film growth technology and materials for the device. Also, the light emitting device may emit white light with high efficiency using phosphor or through combination of colors. Furthermore, the light emitting device has advantages of lower power consumption, semi-permanent lifespan, rapid response time, safety and environmental friendliness, when compared with conventional light sources, such as a fluorescent lamp or an incandescent lamp.

Consequently, application of the light emitting device is expanded to a transmission module of an optical communication apparatus, a light emitting diode backlight that can replace a cold cathode fluorescence lamp constituting the backlight of a liquid crystal display apparatus, and a white light emitting diode lighting apparatus which can replace a fluorescent lamp or an incandescent lamp, an automobile head light and a signal light.

SUMMARY

Embodiments provide a light emitting device wherein current is uniformly distributed, thereby improving light emission efficiency, and the light emitting device is prevented from being locally heated, thereby improving reliability of the light emitting device.

In one embodiment, a light emitting device includes a substrate, a first conductive type semiconductor layer disposed on the substrate, an active layer disposed on one part of the first conductive type semiconductor layer, a second conductive type semiconductor layer disposed on the active layer, a first electrode disposed on the second conductive type semiconductor layer, and a second electrode disposed on the other part of the first conductive type semiconductor layer, wherein a trench is formed at a portion of the second conductive type semiconductor layer, the active layer or the first conductive type semiconductor layer so that the trench is disposed under the first electrode.

Also, the trench may extend in parallel to the extension direction of the substrate.

Also, the trench may be formed at the same level as a surface of the first conductive type semiconductor layer, on which the second electrode is formed, so that the trench and the second electrode are arranged side by side. Alternatively, the trench may be formed at a level different from a surface of the first conductive type semiconductor layer, on which the second electrode is formed, so that trench and the second electrode are arranged side by side.

Also, the light emitting device may further include a reflective layer disposed between the substrate and the first conductive type semiconductor layer and an electron blocking layer disposed between the active layer and the second conductive type semiconductor layer.

Also, the distance from the substrate to the upper surface of the first electrode may be equal to or different from the distance from the substrate to the upper surface of the second electrode.

Also, the trench may have a thickness greater than or less than that of the second electrode. Also, the trench may have a thickness equivalent to 0.25% to 25% of the total thickness of the first conductive type semiconductor layer. For example, the trench may have a thickness of 50 Å to 10000 Å.

Also, the height from the surface of the first conductive type semiconductor layer opposite to the substrate to the trench may be 30% to 80% of the total thickness of the first conductive type semiconductor layer. For example, the height may be 1 μm to 2 μm.

Also, the trench may have a width equivalent to 20% to 40% of the total width of the second conductive type semiconductor layer. For example, the trench may have a width of 20 μm 40 μm.

In another embodiment, a light emitting device includes a substrate, a first conductive type semiconductor layer disposed on the substrate, an active layer disposed on one part of the first conductive type semiconductor layer, a second conductive type semiconductor layer disposed on the active layer, a light transmitting conductive layer disposed on the second conductive type semiconductor layer, a first electrode disposed on the light transmitting conductive layer, and a second electrode disposed on the other part of the first conductive type semiconductor layer, wherein a trench is formed at a portion of the second conductive type semiconductor layer, the active layer or the first conductive type semiconductor layer so that the trench is disposed under the first electrode.

Also, the light transmitting conductive layer may be disposed to expose a portion of the upper surface of the second conductive type semiconductor layer, and the first electrode may be disposed on the exposed portion of the second conductive type semiconductor layer and the light transmitting conductive layer.

Also, the light transmitting conductive layer may be formed of at least one selected from among indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO) and gallium zinc oxide (GZO).

Also, the light emitting device may further include an insulation layer disposed between the first electrode and the second conductive type semiconductor layer. For example, the insulation layer may be formed of $SiO_2$, $SiO_x$, $SiO_xN_y$, $Si_3N_4$ or $Al_2O_3$.

Also, the light emitting device may further include a passivation layer to cover at least one selected from among the first conductive type semiconductor layer, the active layer, the second conductive type semiconductor layer, the light transmitting conductive layer, the first electrode and the second electrode.

Also, the trench may have roughness formed at the surface thereof.

BRIEF DESCRIPTION OF THE DRAWINGS

Arrangements and embodiments may be described in detail with reference to the following drawings in which like reference numerals refer to like elements and wherein.

DESCRIPTION OF SPECIFIC EMBODIMENTS

Figure 1:
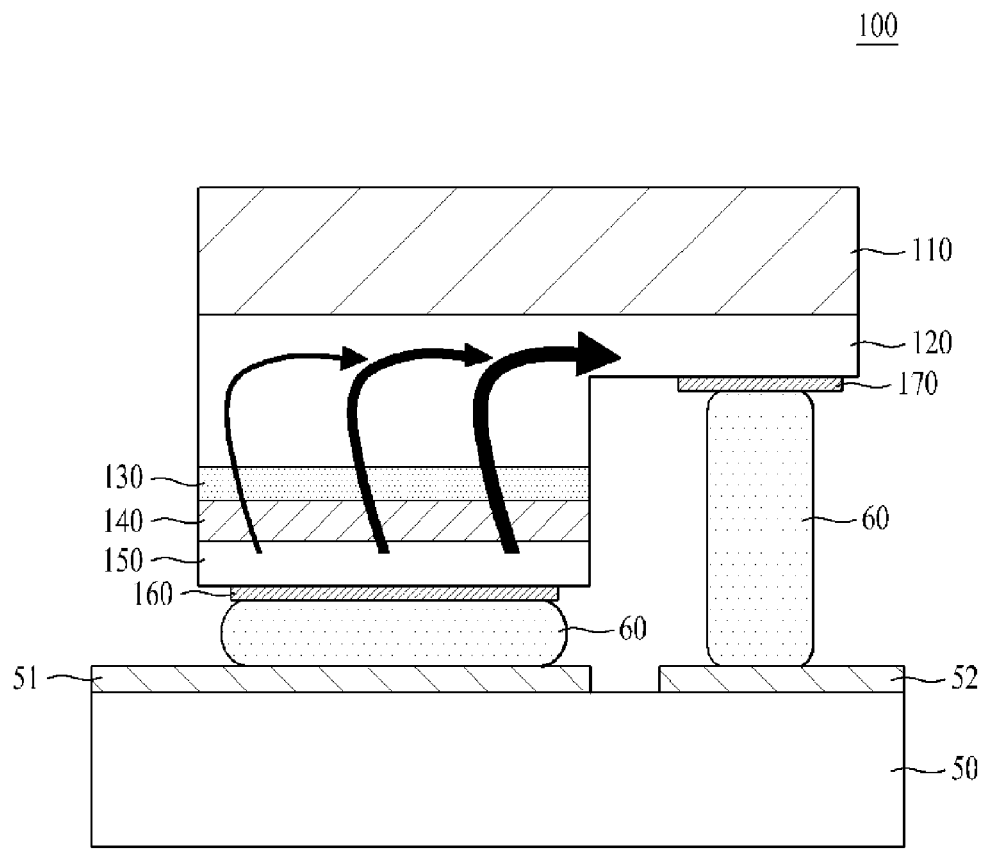
FIG. 1 is a sectional view showing a light emitting device according to an embodiment.

Hereinafter, embodiments will be described with reference to the annexed drawings.

It will be understood that when an element is referred to as being 'on' or 'under' another element, it can be directly on/under the element, and one or more intervening elements may also be present. When an element is referred to as being 'on' or 'under', 'under the element' as well as 'on the element' can be included based on the element.

In the drawings, the sizes of respective layers are exaggerated, omitted, or schematically illustrated for convenience and clarity of description. Further, the sizes of the respective elements do not denote the actual sizes thereof.

FIG. 1 is a sectional view showing a light emitting device 100 according to an embodiment. In these embodiments or other embodiments, the light emitting device 100 may be semiconductor light emitting device, for example light emitting diode.

The light emitting device 100 may include a substrate 110, and a first conductive type semiconductor layer 120, an active layer 130, an electron blocking layer (EBL) 140 and a second conductive type semiconductor layer 150, which are disposed above the substrate 110.

The substrate 110 may be formed of, for example, sapphire ($Al_2O_3$), GaN, SiC, ZnO, Si, GaP, InP, $Ga_2O_3$ or GaAs.

The first conductive type semiconductor layer 120 is disposed on the substrate 110. The first conductive type semiconductor layer 120 may be formed of a semiconductor material, such as GaN, AlN, AlGaN, InGaN, InN or InAlGaN, having a compositional formula of $In_xAl_yGa_{1-x-y}N$ ($0 \leq x \leq 1$, $0 \leq y \leq 1$, $0 \leq x+y \leq 1$) and may be doped with an n type dopant, such as Si, Ge, Sn, Se or Te.

The active layer 130 is disposed on a portion of the first conductive type semiconductor layer 120. The active layer 130 may be formed of a semiconductor material having a compositional formula of, for example, $In_xAl_yGa_{1-x-y}N$ ($0 \leq x \leq 1$, $0 \leq y \leq 1$, $0 \leq x+y \leq 1$) and may have at least one selected from among a quantum wire structure, a quantum dot structure, a single quantum well structure and a multi quantum well (MQW) structure. For example, the active layer 130 may be formed of an InGaN/GaN layer having a multi quantum well structure.

The electron blocking layer 140, which is formed of a semiconductor having an energy band gap greater than that of the second conductive type semiconductor layer 150, may be disposed on the active layer 130.

The second conductive type semiconductor layer 150 is disposed on the electron blocking layer 140. The second conductive type semiconductor layer 150 may be formed of a semiconductor material, such as GaN, AlN, AlGaN, InGaN, InN or InAlGaN, having a compositional formula of $In_xAl_yGa_{1-x-y}N$ ($0 \leq x \leq 1$, $0 \leq y \leq 1$, $0 \leq x+y \leq 1$) and may be doped with a p type dopant, such as Mg, Zn, Ca, Sr or Ba.

Meanwhile, a first electrode 160 is disposed on the second conductive type semiconductor layer 150. Meanwhile, the second conductive type semiconductor layer 150, the electron blocking layer 140, the active layer 130 and the first conductive type semiconductor layer 120 are partially removed by mesa etching so that a portion of the first conductive type semiconductor layer 120 is exposed. A second electrode 170 is formed on the exposed portion of the first conductive type semiconductor layer 120.

The light emitting device 100 may be electrically connected to lead frames 51 and 52 on a package body 50 by flip chip bonding. Namely, solders 60 are bonded between the upper surface of the first electrode 160 and the lead frame 51 and between the upper surface of the second electrode 170 and the lead frame 52.

Current, supplied through the first electrode 160, flows to the second electrode 170 via the second conductive type semiconductor layer 150, the electron blocking layer 140, the active layer 130 and the first conductive type semiconductor layer 120. Due to high resistance of the first conductive type semiconductor layer 120, a larger amount of current, supplied through the first electrode 160, may flow along the shortest course from the first electrode 160 to the second electrode 170 as indicated by arrows. Consequently, a larger amount of current flows to the side of the light emitting device 100 close to the second electrode 170, whereas a smaller amount of current flows to the side of the light emitting device 100 distant from the second electrode 170. In FIG. 1, thicker arrows indicate that a larger amount of current flows.

Such nonuniform flow of current may reduce internal quantum efficiency (IQE) and cause the light emitting device 100 to be locally heated, thereby deteriorating reliability of the light emitting device 100.

Figure 2:
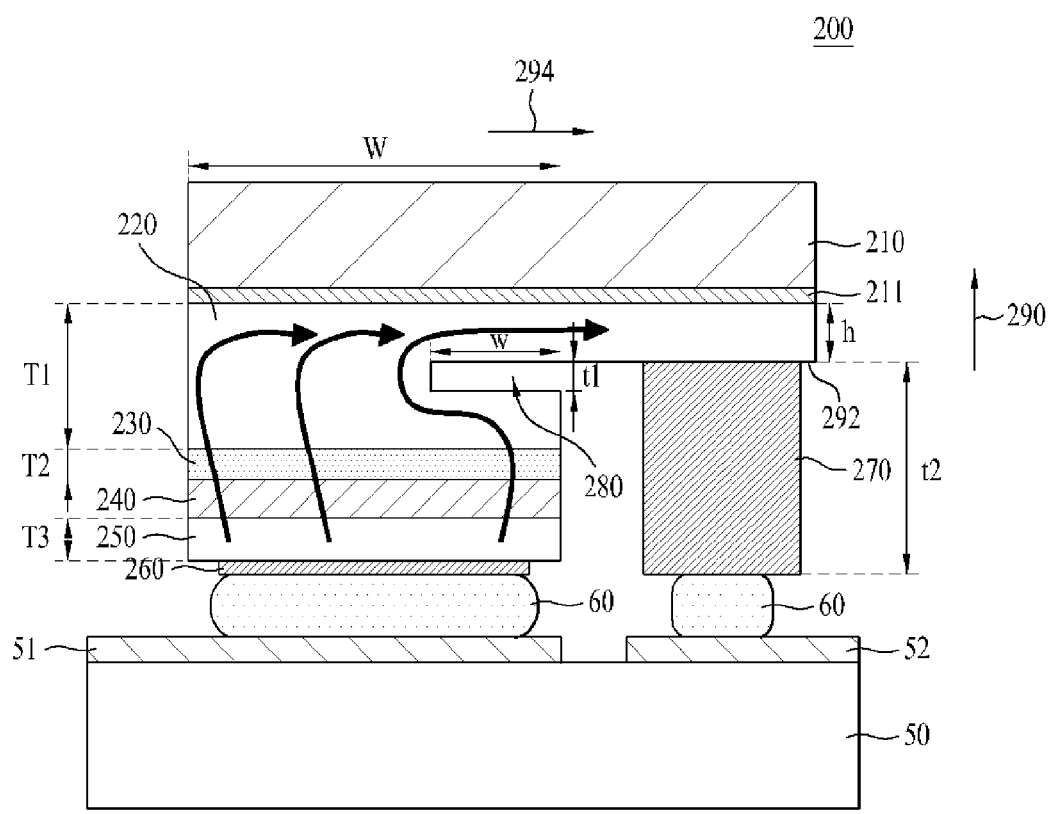
FIG. 2 is a sectional view showing a light emitting device according to another embodiment.

FIG. 2 is a sectional view showing a light emitting device 200 according to another embodiment.

The light emitting device 200 may include a substrate 210, and a first conductive type semiconductor layer 220, an active layer 230, an electron blocking layer 240 and a second conductive type semiconductor layer 250, which are disposed above the substrate 210.

The substrate 210 may be formed of, for example, sapphire ($Al_2O_3$), GaN, SiC, ZnO, Si, GaP, InP, $Ga_2O_3$ or GaAs.

The first conductive type semiconductor layer 220 is disposed on the substrate 210. The first conductive type semiconductor layer 220 may be formed of a semiconductor material, such as GaN, AlN, AlGaN, InGaN, InN or InAlGaN, having a compositional formula of $In_xAl_yGa_{1-x-y}N$ ($0 \leq x \leq 1$, $0 \leq y \leq 1$, $0 \leq x+y \leq 1$) and may be doped with an n type dopant, such as Si, Ge, Sn, Se or Te. For example, the first conductive type semiconductor layer 220 may be formed of a GaN layer or an AlGaN layer doped with an n type dopant.

The active layer 230 is disposed on a portion of the first conductive type semiconductor layer 220. The active layer 230 may be formed of a semiconductor material having a compositional formula of, for example, $In_xAl_yGa_{1-x-y}N$ ($0 \leq x \leq 1$, $0 \leq y \leq 1$, $0 \leq x+y \leq 1$) and may have at least one selected from among a quantum wire structure, a quantum dot structure, a single quantum well structure and a multi quantum well (MQW) structure. For example, the active layer 230 may be formed of an InGaN/GaN layer having a multi quantum well structure.

If the active layer 230 is configured to have a quantum well structure, the active layer 230 may have a single or quantum well layer structure including a well layer having a compositional formula of $In_xAl_yGa_{1-x-y}N$ (0≤x≤1, 0≤y≤1, 0≤x+y≤1) and a barrier layer having a compositional formula of $In_aAl_bGa_{1-a-b}N$ (0≤a≤1, 0≤b≤1, 0≤a+b≤1). The well layer may be formed of a material having an energy band gap less than that of the barrier layer.

The active layer 230 emits light using energy generated during recombination of electrodes supplied from the first conductive type semiconductor layer 220 and holes supplied from the second conductive type semiconductor layer 250.

A reflective layer 211 may be disposed between the substrate 210 and the first conductive type semiconductor layer 220. The reflective layer 211 may prevent absorption of light emitted from the active layer 230 into the substrate 210, thereby improving light emission efficiency of the light emitting device.

The reflective layer 211 may be a distributed Bragg reflector (DBR) layer to reflect light having a specific wavelength band. The DBR layer, including alternately stacked layers formed of two materials having different refractive indices, may transmit light having a first wavelength band and reflect light having a second wavelength band. Also, the reflective layer 211 may be formed of photo solder resist (PSR), especially white photo solder resist (white PSR).

The electron blocking layer 240, which is formed of a semiconductor having an energy band gap greater than that of the second conductive type semiconductor layer 250, may be disposed on the active layer 230. In this embodiment, the electron blocking layer 240 may be formed of AlGaN. Alternatively, the electron blocking layer 240 may be omitted.

Since the electron blocking layer 240 has an energy band gap greater than that of the second conductive type semiconductor layer 250, overflow of electrons supplied from the first conductive type semiconductor layer 220 to the second conductive type semiconductor layer 250 without recombination thereof at the active layer 230 may be effectively prevented. Consequently, the electron blocking layer 240 may reduce the number of electrons wasted due to overflow, thereby improving luminous efficacy of the light emitting device.

The second conductive type semiconductor layer 250 is disposed on the electron blocking layer 240. The second conductive type semiconductor layer 250 may be formed of a semiconductor material, such as GaN, AlN, AlGaN, InGaN, InN or InAlGaN, having a compositional formula of $In_xAl_yGa_{1-x-y}N$ (0≤x≤1, 0≤x+y≤1) and may be doped with a p type dopant, such as Mg, Zn, Ca, Sr or Ba. For example, the second conductive type semiconductor layer 250 may be formed of a GaN layer doped with a p type dopant.

A first electrode 260 is disposed on the second conductive type semiconductor layer 250. Meanwhile, the second conductive type semiconductor layer 250, the electron blocking layer 240, the active layer 230 and the first conductive type semiconductor layer 220 are partially removed by mesa etching so that a portion of the first conductive type semiconductor layer 220 is exposed. A second electrode 270 is disposed on the exposed portion of the first conductive type semiconductor layer 220, i.e. the portion of the first conductive type semiconductor layer 220 where the active layer 230 is not formed.

In this embodiment, the first conductive type semiconductor layer 220 is formed of an n type semiconductor, and the second conductive type semiconductor layer 250 is formed of a p type semiconductor. Alternatively, the first conductive type semiconductor layer 220 may be formed of a p type semiconductor, and the second conductive type semiconductor layer 250 may be formed of an n type semiconductor.

The light emitting device 200 may be mounted on a package body 50 in a state in which the light emitting device 200 is turned over, i.e. the substrate 210 is above the second conductive type semiconductor layer 250. The light emitting device 200 may be electrically connected to lead frames 51 and 52 on the package body 50 by flip chip bonding. Namely, solders 60 are bonded between the upper surface of the first electrode 260 and the lead frame 51 and between the upper surface of the second electrode 270 and the lead frame 52. The distance from the substrate 210 to an upper surface of the first electrode 260 may be equal to the distance from the substrate 210 to an upper surface of the second electrode 270. Alternatively, the distance from the substrate 210 to the upper surface of the first electrode 260 may differ from the distance from the substrate 210 to the upper surface of the second electrode 270.

In this embodiment, a trench is formed at a portion of the second conductive type semiconductor layer 250, the active layer 230 or the first conductive type semiconductor layer 220 so that the trench is disposed under the first electrode 260.

For example, as shown in FIG. 2, a portion of the first conductive type semiconductor layer 220 adjacent to the second electrode 270 may be removed in the horizontal direction to form a trench 280 in the first conductive type semiconductor layer 220.

If the height h from the surface of the first conductive type semiconductor layer 220 opposite to the substrate 210 to the trench 280 is too small, sheet resistance of the first conductive type semiconductor layer 220 is increased with the result that current may not smoothly flow, thereby increasing power consumption. On the other hand, if the height h is too large, current may nonuniformly flow. For this reason, the height h may be equivalent to 30 to 80% of the total thickness T1 of the first conductive type semiconductor layer 220. For example, the height h may be 1 μm to 2 μm.

If the width w of the trench 280 is too small, the trench 280 may not substantially bypass current. Namely, if the width w is too small, current may flow as shown in FIG. 1 without being affected by the trench 280. On the other hand, if the width w is too large, the trench 280 may disturb the flow of current. For this reason, the width w of the trench 280 may be equivalent to 20 to 40% of the total width W of the second conductive type semiconductor layer 250. For example, the width W of the second conductive type semiconductor layer 250 may be 100 μm, and the width w of the trench 280 may be 20 μm to 40 μm.

Also, if the thickness t1 of the trench 280 is too large, the height h is excessively decreased with the result that the same problem as caused when the height h is too small may be caused. On the other hand, if the thickness t1 of the trench 280 is too small, the height h is excessively increased with the result that the same problem as caused when the height h is too large may be caused. For this reason, the thickness t1 of the trench 280 may be equivalent to 0.25 to 25% of the total thickness T1 of the first conductive type semiconductor layer 220. For example, the thickness t1 of the trench 280 may be 50 to 10000 Å.

In this embodiment, the trench 280 may be formed in a direction 294 perpendicular to a direction 290 in which the first conductive type semiconductor layer 220, the active layer 230, the electron blocking layer 240 and the second conductive type semiconductor layer 250 are stacked. Namely, the trench 280 may extend in parallel to the extension direction of the substrate 210.

Also, the trench 280 may be formed on the upper surface 292 of the first conductive type semiconductor layer 220, on which the second electrode 270 is formed, so that the trench 280 and the second electrode 270 are disposed side by side in the horizontal direction 294. Namely, the trench 280 may be formed at the same level as the upper surface 292 of the first conductive type semiconductor layer 220, on which the second electrode 270 is formed, so that the trench 280 and the second electrode 270 are disposed side by side. Also, as shown in FIG. 2, the thickness t1 of the trench 280 may be less than the thickness t2 of the second electrode 270; however, this embodiment is not limited thereto. Namely, the thickness t1 of the trench 280 may be equal to or greater than the thickness t2 of the second electrode 270.

Since the trench 280 is adjacent to the second electrode 270, current, supplied through the first electrode 260, bypasses the trench 280 as indicated by arrows in FIG. 2.

Since current, supplied through the first electrode 260, bypasses the trench 280 and then flow to the second electrode 270, concentration of current upon the side adjacent to the second electrode 270 is reduced, thereby achieving uniform flow of current.

Such uniform flow of current may improve IQE and prevent the light emitting device 200 from being locally heated, thereby improving reliability of the light emitting device 200.

Figure 3:
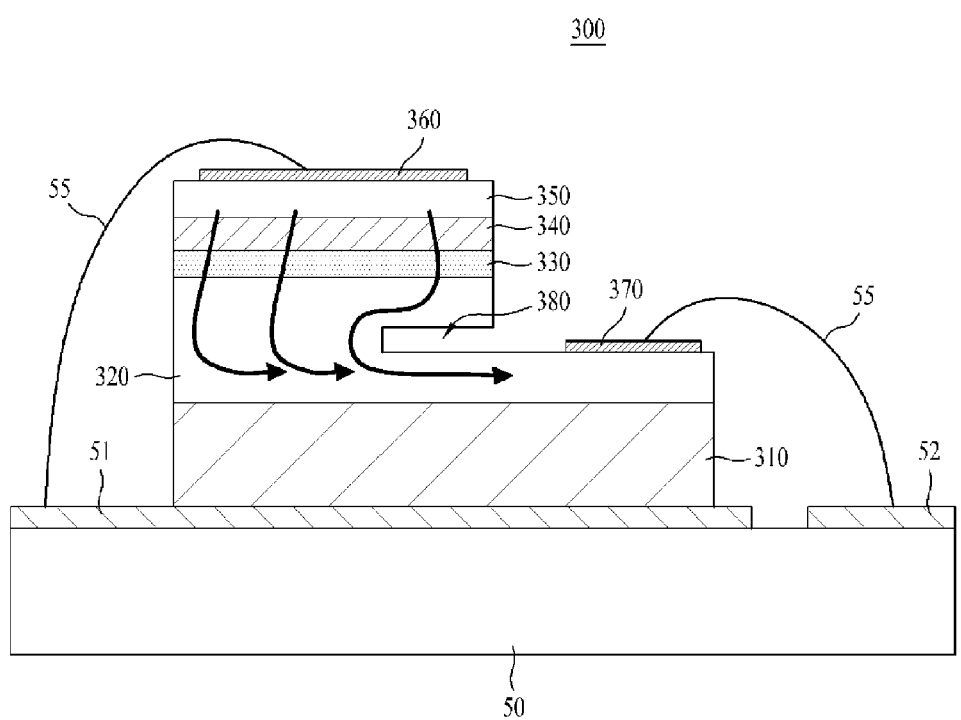
FIG. 3 is a sectional view showing a light emitting device according to still another embodiment.

FIG. 3 is a sectional view showing a light emitting device 300 according to still another embodiment.

The light emitting device 300 may include a substrate 310, and a first conductive type semiconductor layer 320, an active layer 330, an electron blocking layer 340 and a second conductive type semiconductor layer 350, which are disposed above the substrate 310. The substrate 310, the first conductive type semiconductor layer 320, the active layer 330, the electron blocking layer 340 and the second conductive type semiconductor layer 350 are identical in construction to the substrate 210, the first conductive type semiconductor layer 220, the active layer 230, the electron blocking layer 240 and the second conductive type semiconductor layer 250 shown in FIG. 2, and therefore, a detailed description thereof will be omitted.

A first electrode 360 is disposed on the second conductive type semiconductor layer 350. Meanwhile, the second conductive type semiconductor layer 350, the electron blocking layer 340, the active layer 330 and the first conductive type semiconductor layer 320 are partially removed by mesa etching so that a portion of the first conductive type semiconductor layer 320 is exposed. A second electrode 370 is disposed on the exposed portion of the first conductive type semiconductor layer 320, i.e. the portion of the first conductive type semiconductor layer 320 where the active layer 330 is not formed.

The light emitting device 300 may be electrically connected to lead frames 51 and 52 on a package body 50 via wires 55.

In this embodiment, the first conductive type semiconductor layer 320 is formed of an n type semiconductor, and the second conductive type semiconductor layer 350 is formed of a p type semiconductor. Alternatively, the first conductive type semiconductor layer 320 may be formed of a p type semiconductor, and the second conductive type semiconductor layer 350 may be formed of an n type semiconductor.

A trench is formed at a portion of the second conductive type semiconductor layer 350, the active layer 330 or the first conductive type semiconductor layer 320 so that the trench is disposed under the first electrode 360.

For example, as shown in FIG. 3, a portion of the first conductive type semiconductor layer 320 adjacent to the second electrode 370 may be removed in the horizontal direction to form a trench 380 in the first conductive type semiconductor layer 320.

The height h, the width w and the thickness t1 of the trench 380, the relationship between the height h of the trench 380 and the total thickness T1 of the first conductive type semiconductor layer 320, the relationship between the width w of the trench 380 and the width W of the second conductive type semiconductor layer 350, and the relationship between the thickness t1 of the trench 380 and the total thickness T1 of the first conductive type semiconductor layer 320 are the same as those in the trench 280 shown in FIG. 2, and therefore, a detailed description thereof will be omitted.

Also, the thickness of the trench 380 shown in FIG. 3 is greater than the thickness of the second electrode 370; however, this embodiment is not limited thereto. Namely, the thickness of the trench 380 may be equal to or less than that of the second electrode 370.

Since the trench 380 is adjacent to the second electrode 370, current, supplied through the first electrode 360, bypasses the trench 380 as indicated in an arrow.

As a result, concentration of current, supplied through the first electrode 360, upon the side adjacent to the second electrode 370 is reduced, thereby achieving uniform flow of current. Consequently, IQE of the light emitting device 300 is improved, and the light emitting device 300 is prevented from being locally heated, thereby improving reliability of the light emitting device 300.

Figure 4:
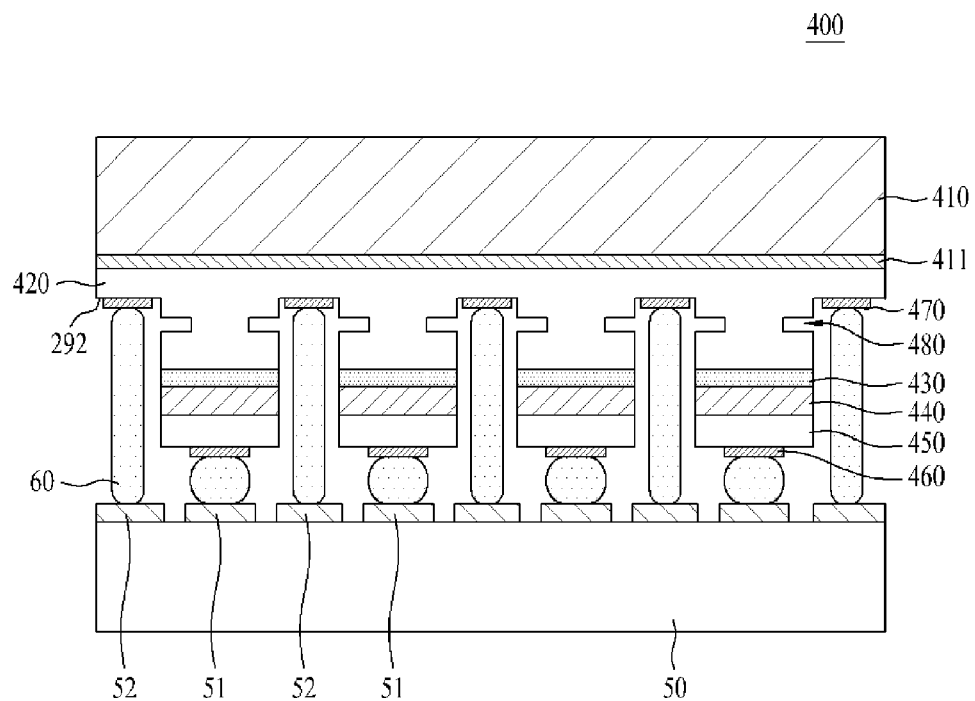
FIG. 4 is a sectional view showing a light emitting device according to still another embodiment.

FIG. 4 is a sectional view showing a light emitting device 400 according to still another embodiment.

The light emitting device 400 may include a substrate 410, and a first conductive type semiconductor layer 420, an active layer 430, an electron blocking layer 440 and a second conductive type semiconductor layer 450, which are disposed above the substrate 410.

The substrate 410 may be formed of, for example, sapphire ($Al_2O_3$), GaN, SiC, ZnO, Si, GaP, InP, $Ga_2O_3$ or GaAs.

A reflective layer 411 may be disposed on the substrate 410. The reflective layer 411 may prevent absorption of light emitted from the active layer 430 into the substrate 410, thereby improving light emission efficiency of the light emitting device.

The reflective layer 411 may be a distributed Bragg reflector (DBR) layer to reflect light having a specific wavelength band. The DBR layer, including alternately stacked layers formed of two materials having different refractive indices, may transmit light having a first wavelength band and reflect light having a second wavelength band. Also, the reflective layer 411 may be formed of photo solder resist (PSR), especially white photo solder resist (white PSR).

The first conductive type semiconductor layer 420 is disposed on the reflective layer 411. The first conductive type semiconductor layer 420 may be formed of a semiconductor material, such as GaN, AlN, AlGaN, InGaN, InN or InAlGaN, having a compositional formula of $In_xAl_yGa_{1-x-y}N$ ($0 \leq x \leq 1$, $0 \leq y \leq 1$, $0 \leq x+y \leq 1$) and may be doped with an n type dopant, such as Si, Ge, Sn, Se or Te. For example, the first conductive type semiconductor layer 420 may be formed of GaN layer or AlGaN layer which is doped with the n type dopant.

The active layer 430 is disposed on a portion of the first conductive type semiconductor layer 420. The active layer 430 may be formed of a semiconductor material having a compositional formula of, for example, $In_xAl_yGa_{1-x-y}N$ ($0 \leq x \leq 1$, $0 \leq y \leq 1$, $0 \leq x+y \leq 1$) and may have at least one selected from among a quantum wire structure, a quantum dot structure, a single quantum well structure and a multi quantum well (MQW) structure. For example, the active layer 430 may be formed of an InGaN/GaN layer having a multi quantum well structure.

If the active layer 430 is configured to have a quantum well structure, the active layer 430 may have a single or quantum well layer structure including a well layer having a compositional formula of $In_xAl_yGa_{1-x-y}N$ ($0 \leq x \leq 1$, $0 \leq y \leq 1$, $0 \leq x+y \leq 1$) and a barrier layer having a compositional formula of $In_aAl_bGa_{1-a-b}N$ ($0 \leq a \leq 1$, $0 \leq b \leq 1$, $0 \leq a+b \leq 1$). The well layer may be formed of a material having an energy band gap less than that of the barrier layer.

The electron blocking layer (EBL) 440, which is formed of a semiconductor having an energy band gap greater than that of the second conductive type semiconductor layer 450, may be disposed on the active layer 430. In this embodiment, the electron blocking layer 440 may be formed of AlGaN. Alternatively, the electron blocking layer 440 may be omitted.

The second conductive type semiconductor layer 450 is disposed on the electron blocking layer 440. The second conductive type semiconductor layer 450 may be formed of a semiconductor material, such as GaN, AlN, AlGaN, InGaN, InN or InAlGaN, having a compositional formula of $In_xAl_yGa_{1-x-y}N$ ($0 \leq x \leq 1$, $0 \leq y \leq 1$, $0 \leq x+y \leq 1$) and may be doped with a p type dopant, such as Mg, Zn, Ca, Sr or Ba. For example, the second conductive type semiconductor layer 450 may be formed of a GaN layer doped with a p type dopant.

A first electrode 460 is disposed on the second conductive type semiconductor layer 450. Meanwhile, the second conductive type semiconductor layer 450, the electron blocking layer 440, the active layer 430 and the first conductive type semiconductor layer 420 are partially removed by mesa etching so that a portion of the first conductive type semiconductor layer 420 is exposed. A second electrode 470 is disposed on the exposed portion of the first conductive type semiconductor layer 420, i.e. the portion of the first conductive type semiconductor layer 420 where the active layer 430 is not formed.

The second conductive type semiconductor layer 450, the electron blocking layer 440 and the active layer 430 may be removed at intervals to form a plurality of second electrodes 470. Correspondingly, a plurality of first electrodes 460 is formed.

A trench is formed at a portion of the second conductive type semiconductor layer 450, the active layer 430 or the first conductive type semiconductor layer 420 so that the trench is disposed under the first electrode 460.

For example, as shown in FIG. 4, a portion of the first conductive type semiconductor layer 420 adjacent to the second electrode 470 may be removed in the horizontal direction to form a trench 480 in the first conductive type semiconductor layer 420.

In FIG. 2 or 3, the trench 280 or 380 may be formed at the same level as the upper surface 292 of the first conductive type semiconductor layer 220 or 320, on which the second electrode 270 or 370 is formed, so that trench 280 or 380 and the second electrode 270 or 370 are disposed side by side.

However, as shown in FIG. 4, the trench 480 may be formed at a level different from the upper surface 292 of the first conductive type semiconductor layer 420, on which the second electrode 470 is formed, so that trench 480 and the second electrode 470 are disposed side by side. Except for this, the trench 480 is identical in construction to the trench 280 shown in FIG. 2. Namely, the height h, the width w and the thickness t1 of the trench 480, the relationship between the height h of the trench 480 and the total thickness T1 of the first conductive type semiconductor layer 420, the relationship between the width w of the trench 480 and the width W of the second conductive type semiconductor layer 450, and the relationship between the thickness t1 of the trench 480 and the total thickness T1 of the first conductive type semiconductor layer 420 are the same as those in the trench 280 shown in FIG. 2, and therefore, a detailed description thereof will be omitted.

In this embodiment, a plurality of first electrodes 460 and a plurality of second electrodes 470 are formed in one light emitting device 400 so that the first electrodes 460 and second electrodes 470 are alternately disposed. Consequently, a plurality of unit light emitting devices, each of which has a first electrode 460 and a second electrode 470, is connected to each other to constitute the light emitting device 400.

In each of the unit light emitting devices, second electrodes 470 are positioned at opposite sides of the first conductive type semiconductor layer 420. Consequently, trenches 480 may be disposed at the opposite sides of the first conductive type semiconductor layer 420.

The light emitting device 400 may be electrically connected to lead frames 51 and 52 on a package body 50 by flip chip bonding in a state in which the light emitting device 400 is turned over In this embodiment, the first conductive type semiconductor layer 420 is formed of an n type semiconductor, and the second conductive type semiconductor layer 450 is formed of a p type semiconductor. Alternatively, the first conductive type semiconductor layer 420 may be formed of a p type semiconductor, and the second conductive type semiconductor layer 450 may be formed of an n type semiconductor.

In the light emitting device and the light emitting device package according to this embodiment, uniform distribution of current is achieved. Consequently, light emission efficiency of the light emitting device and the light emitting device package is improved, and the light emitting device and the light emitting device package are prevented from being locally heated, thereby improving reliability of the light emitting device and the light emitting device package.

Also, when the light emitting device 300 is electrically connected to the lead frames 51 and 52 on the package body 50 via the wires 55, as shown in FIG. 3, the first electrode 360 of the light emitting device 300 may have various shapes as follows.

Figure 5:
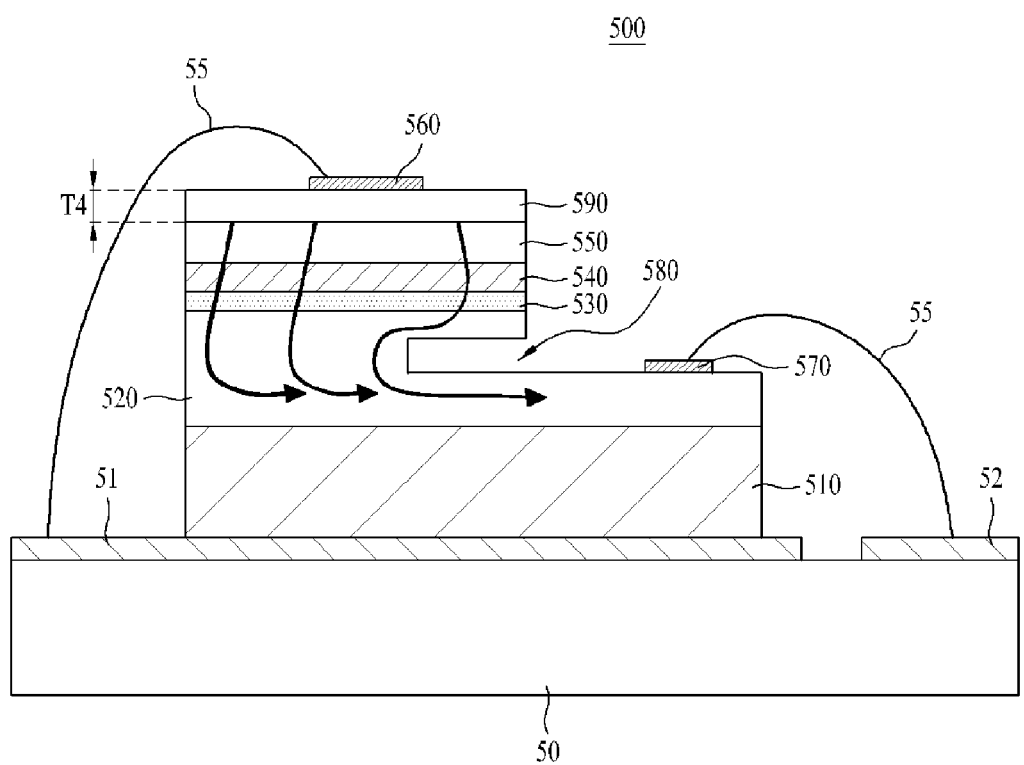
FIG. 5 is a sectional view showing a light emitting device according to still another embodiment.

FIG. 5 is a sectional view showing a light emitting device 500 according to still another embodiment.

A substrate 510, a first conductive type semiconductor layer 520, an active layer 530, an electron blocking layer 540, a second conductive type semiconductor layer 550, a second electrode 570 and a trench 580 shown in FIG. 5 are identical in construction to the substrate 310, the first conductive type semiconductor layer 320, the active layer 330, the electron blocking layer 340, the second conductive type semiconductor layer 350, the second electrode 370 and the trench 380 shown in FIG. 3, and therefore, a detailed description thereof will be omitted.

Unlike the light emitting device 300 shown in FIG. 3, the light emitting device 500 shown in FIG. 5 may further include a light transmitting conductive layer 590. In this case, the light transmitting conductive layer 590 is disposed on the second conductive type semiconductor layer 550, and a first electrode 560 is disposed on the light transmitting conductive layer 590.

Figure 6:
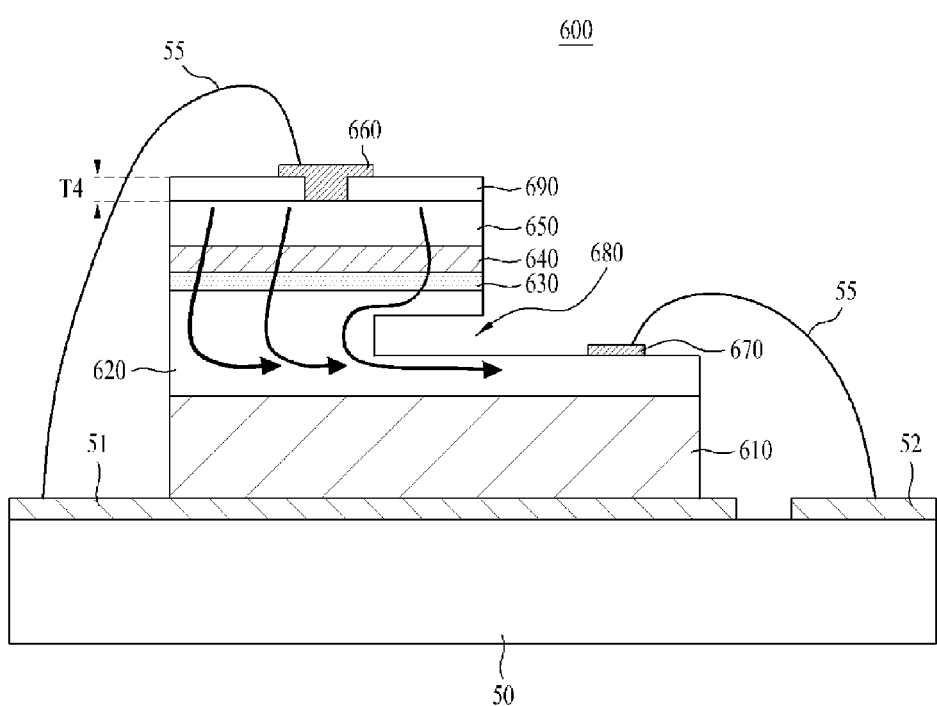
FIG. 6 is a sectional view showing a light emitting device according to still another embodiment.

FIG. 6 is a sectional view showing a light emitting device 600 according to still another embodiment.

A substrate 610, a first conductive type semiconductor layer 620, an active layer 630, an electron blocking layer 640, a second conductive type semiconductor layer 650, a second electrode 670 and a trench 680 shown in FIG. 6 are identical in construction to the substrate 310, the first conductive type semiconductor layer 320, the active layer 330, the electron blocking layer 340, the second conductive type semiconductor layer 350, the second electrode 370 and the trench 380 shown in FIG. 3, and therefore, a detailed description thereof will be omitted.

The light transmitting conductive layer 590 shown in FIG. 5 is disposed over the entire surface of the second conductive type semiconductor layer 550, whereas a light transmitting conductive layer 690 shown in FIG. 6 may be disposed to expose a portion of the upper surface of the second conductive type semiconductor layer 650. In this case, a first electrode 660 is disposed on the exposed portion of the second conductive type semiconductor layer 650 and on an upper surface of the light transmitting conductive layer 690.

The light transmitting conductive layers 590 and 690 shown in FIGS. 5 and 6 may be formed of at least one selected from among indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO) and gallium zinc oxide (GZO).

In FIGS. 5 and 6, the light transmitting conductive layers 590 and 690 may have a thickness T4 of 20 nm to 200 nm.

Figure 7:
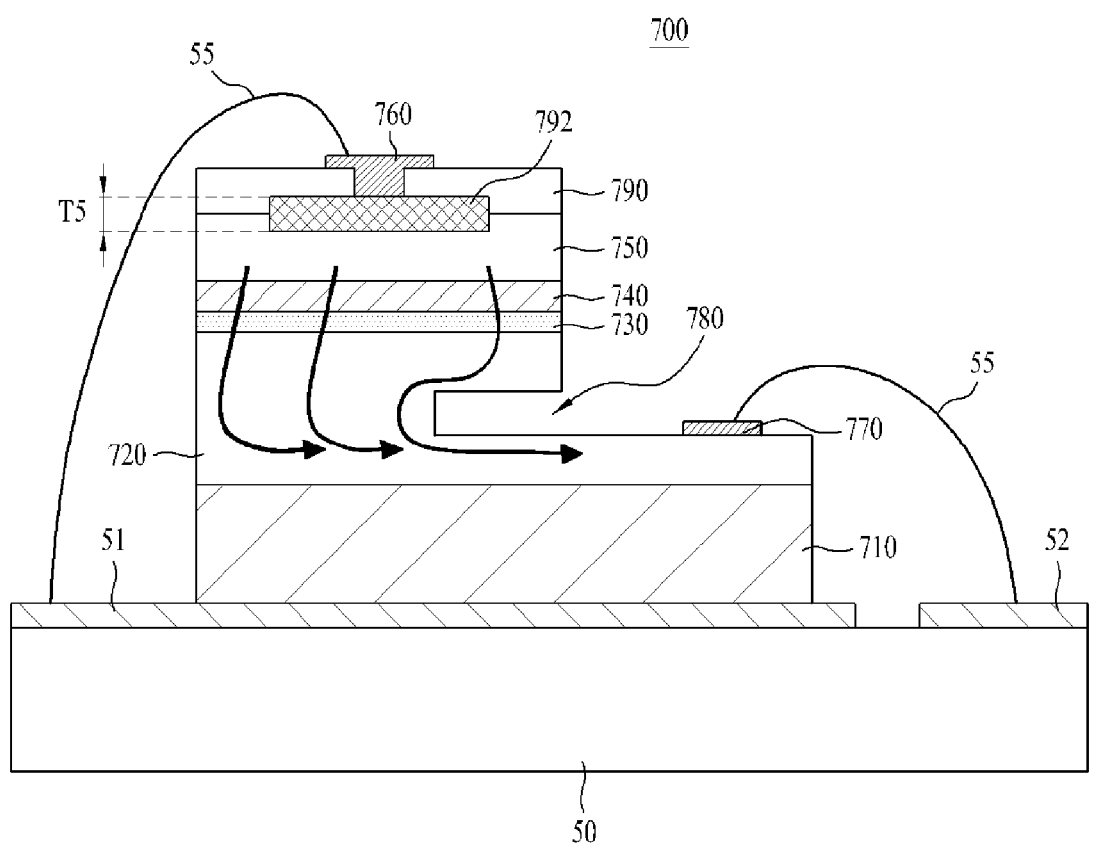
FIG. 7 is a sectional view showing a light emitting device according to still another embodiment.

FIG. 7 is a sectional view showing a light emitting device 700 according to still another embodiment.

A substrate 710, a first conductive type semiconductor layer 720, an active layer 730, an electron blocking layer 740, a second conductive type semiconductor layer 750, a second electrode 770 and a trench 780 shown in FIG. 7 are identical in construction to the substrate 310, the first conductive type semiconductor layer 320, the active layer 330, the electron blocking layer 340, the second conductive type semiconductor layer 350, the second electrode 370 and the trench 380 shown in FIG. 3, and therefore, a detailed description thereof will be omitted.

The light emitting device 700 shown in FIG. 7 may further include an insulation layer 792 partially disposed between a first electrode 760 and the second conductive type semiconductor layer 750 and between a light transmitting conductive layer 790 and the second conductive type semiconductor layer 750. Except for this, the light emitting device 700 shown in FIG. 7 is identical to the light emitting device 600 shown in FIG. 6. For example, the insulation layer 792 may be formed of $SiO_2$, $SiO_x$, $SiO_xN_y$, $Si_3N_4$ or $Al_2O_3$. Also, the insulation layer 792 may have a thickness T5 of 10 nm to 500 nm; however, the thickness of the insulation layer 792 is not limited thereto.

Figure 8:
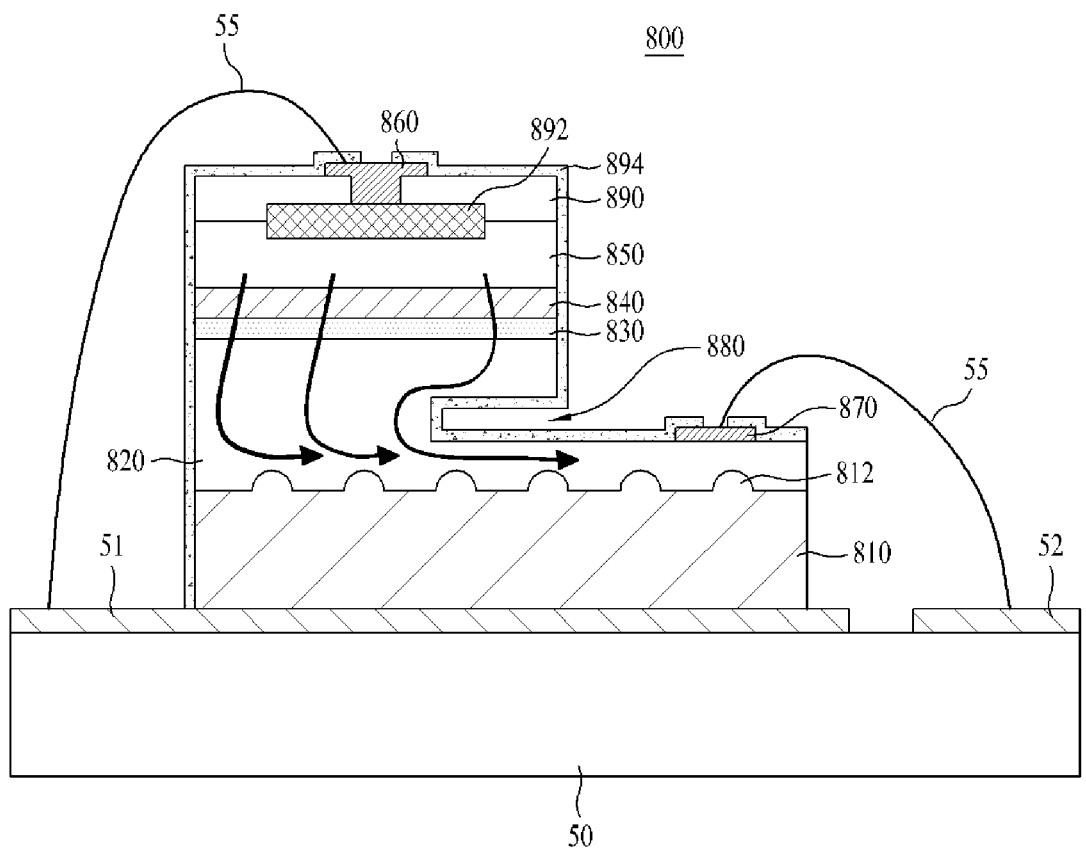
FIG. 8 is a sectional view showing a light emitting device according to still another embodiment.

FIG. 8 is a sectional view showing a light emitting device 800 according to still another embodiment.

Unlike the light emitting device 700 shown in FIG. 7, the light emitting device 800 shown in FIG. 8 may further include a passivation layer 894, and a substrate 810 may be a patterned sapphire substrate (PSS) having protrusions 812 formed at the upper surface thereof. For example, substrate 810 may be formed of at least one selected from among sapphire ($Al_2O_3$), SiC, GaAs, GaN, ZnO, Si, GaP, InP and Ge; however, the material for the substrate 810 is not limited thereto.

If the protrusions are formed at the upper surface of the substrate 810 as described above, light emitted from an active layer 830 may be efficiently reflected in a scattered manner and advance toward a light emission plane. Consequently, light extraction efficiency (LEE) may be improved. Except for this, the light emitting device 800 shown in FIG. 8 is identical to the light emitting device 700 shown in FIG. 7.

The passivation layer 894 shown in FIG. 8 covers at least one selected from among a first conductive type semiconductor layer 820, the active layer 830, a second conductive type semiconductor layer 850, a light transmitting conductive layer 890, a first electrode 860 and a second electrode 870. For example, the passivation layer 894 covers sides of the first conductive type semiconductor layer 820, the active layer 830, an electron blocking layer 840, the second conductive type semiconductor layer 850, and the light transmitting conductive layer 890. Also, the passivation layer 894 partially covers sides and upper surfaces of the first and second electrodes 860 and 870 as well as the upper part of the light transmitting conductive layer 890. The passivation layer 894 functions to prevent leakage of current from the light emitting device 800 and to protect a chip from particles.

In the light emitting devices 100 to 800 shown in FIGS. 1 to 8, the first conductive type semiconductor layer 120, 220, 320, 420, 520, 620, 720 or 820 may have a thickness T1 of 1 μm to 3 μm, the active layer 130, 230, 330, 430, 530, 630, 730 or 830 may have a thickness T2 of 10 nm to 100 nm, and the second conductive type semiconductor layer 150, 250, 350, 450, 550, 650, 750 or 850 may have a thickness T3 of 50 nm to 300 nm.

Also, in the light emitting devices 100 to 800 shown in FIGS. 1 to 8, the first electrode 160, 260, 360, 460, 560, 660, 760 or 860 may be formed of a material having ohmic and reflection function.

Also, in the light emitting devices 200 to 800 shown in FIGS. 2 to 8, the trench 280, 380, 480, 580, 680, 780 or 880 is formed in the first conductive type semiconductor layer 220, 320, 420, 520, 620, 720 or 820; however, these embodiments are not limited thereto. Namely, the trench may be formed at a portion of the second conductive type semiconductor layer 250, 350, 450, 550, 650, 750 or 850, the active layer 230, 330, 430, 530, 630, 730 or 830 or the first conductive type semiconductor layer 220, 320, 420, 520, 620, 720 or 820, so that the trench is disposed under the first electrode 260, 360, 460, 560, 660, 760 or 860. The trench 280, 380, 480, 580, 680, 780 or 880 may be formed adjacent to the second electrode 270, 370, 470, 570, 670, 770 or 870.

For example, the trench 280, 380, 480, 580, 680, 780 or 880 may be formed in the active layer 230, 330, 430, 530, 630, 730 or 830, the electron blocking layer 240, 340, 440, 540, 640, 740 or 840, or the second conductive type semiconductor layer 250, 350, 450, 550, 650, 750 or 850 instead of the first conductive type semiconductor layer 220, 320, 420, 520, 620, 720 or 820. Alternatively, the trench 280, 380, 480, 580, 680, 780 or 880 may be formed at the interface between the first conductive type semiconductor layer 220, 320, 420, 520, 620, 720 or 820 and the active layer 230, 330, 430, 530, 630, 730 or 830. Alternatively, the trench 280, 380, 480, 580, 680, 780 or 880 may be formed at the interface between the active layer 230, 330, 430, 530, 630, 730 or 830 and the electron blocking layer 240, 340, 440, 540, 640, 740 or 840. Alternatively, the trench 280, 380, 480, 580, 680, 780 or 880 may be formed at the interface between the electron blocking layer 240, 340, 440, 540, 640, 740 or 840 and the second conductive type semiconductor layer 250, 350, 450, 550, 650, 750 or 850.

Figure 9A:
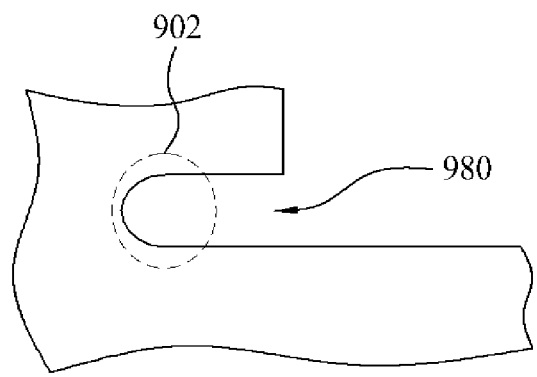
FIGS. 9A to 9C are sectional views showing shapes of a trench according to an embodiment.
Figure 9B:
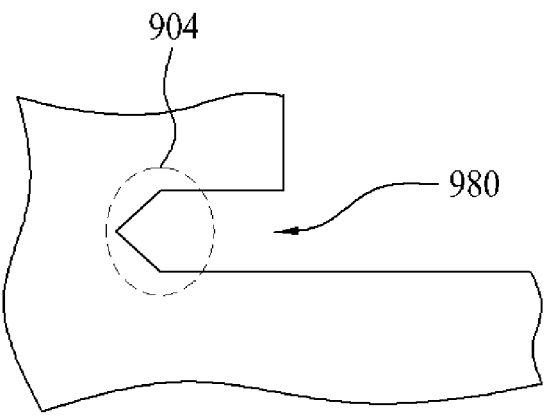
Figure 9C:
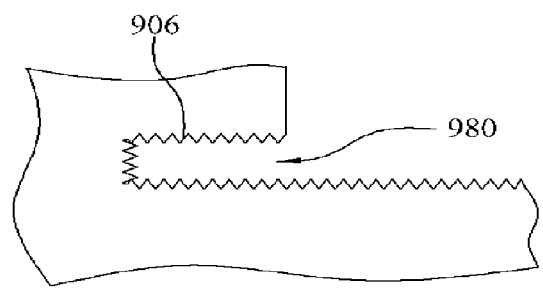

FIGS. 9A to 9C are sectional views showing shapes of a trench 980 according to an embodiment.

The trench 280, 380, 480, 580, 680, 780 or 880 shown in FIGS. 2 to 8 has a perpendicular inner side surface; however, the shape of the trench is not limited thereto. The trench 280, 380, 480, 580, 680, 780 or 880 may have various shapes.

For example, an inner side surface 902 of the trench 980 may not be perpendicular but may be round as shown in FIG. 9A. Alternatively, as shown in FIG. 9B, the inner side surface 904 of the trench 980 may be formed in a triangular shape about a point of inflection. Alternatively, as shown in FIG. 9C, the surface of the trench 980 may not be smooth but roughness may be formed at the surface of the trench 980. When the roughness is formed at the surface of the trench 980, light emission efficiency is further improved.

Figure 10:
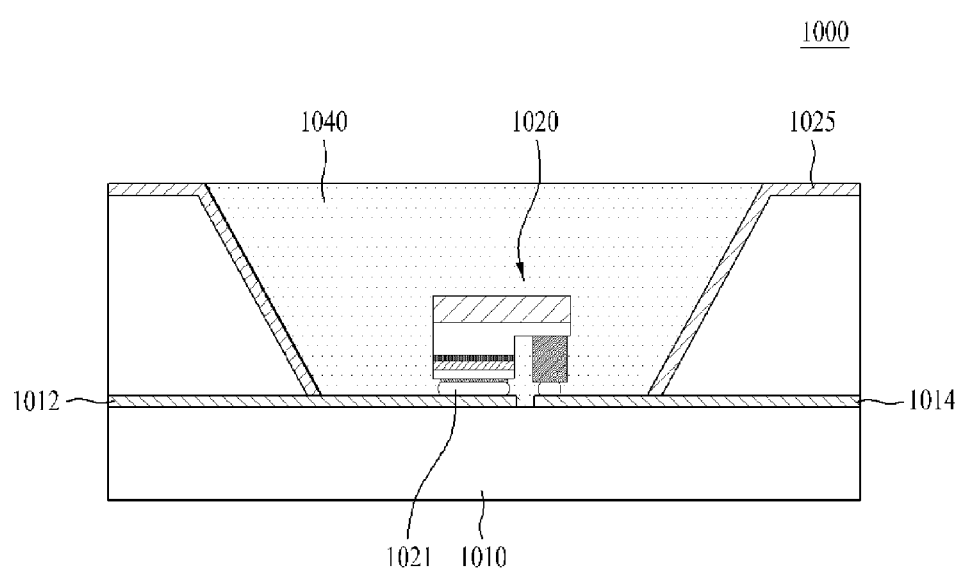
FIG. 10 is a view showing a light emitting device package according to an embodiment.

FIG. 10 is a view showing a light emitting device package 1000 according to an embodiment.

The light emitting device package 1000 includes a package body 1010, lead frames 1012 and 1014, a light emitting device 1020, a reflective plate 1025 and a resin layer 1040.

A cavity may be formed at the upper surface of the package body 1010. The cavity may have a tilted side wall. The package body 1010 may be formed of a substrate, such as a silicon-based wafer level package, a silicon substrate, silicon carbide (SiC) or aluminum nitride (AlN), exhibiting high insulation and thermal conductivity. The package body 1010 may include a plurality of stacked substrates. The material, structure and shape of the package body 1010 are not limited.

The lead frames 1012 and 1014 are disposed on the package body 1010 so that the lead frames 1012 and 1014 are electrically isolated from each other in consideration of heat dissipation or installation of the light emitting device 1020. The light emitting device 1020 is electrically connected to the lead frames 1012 and 1014. The light emitting device 1020 may be one of the light emitting devices 200 to 800 shown in FIGS. 2 to 8.

The light emitting device 1020 may be electrically connected to the lead frames 1012 and 1014 on the package body 1010 by flip chip bonding. At this time, the light emitting device 1020 may be electrically connected to the lead frames 1012 and 1014 on the package body 1010 via solders 1021. Alternatively, as shown in FIGS. 3 and 5 to 8, the light emitting device 1020 may be electrically connected to the lead frames 1012 and 1014 on the package body 1010 via the wires 55.

The reflective plate 1025 is disposed at the side wall of the cavity of the package body 1010 to guide light emitted from the light emitting device 1020 in a predetermined direction. The reflective plate 1025 is formed of a light reflective material. For example, reflective plate 1025 may be a metal coating or a thin metal sheet.

The resin layer 1040 surrounds the light emitting device 1020 positioned in the cavity of the package body 1010 to protect the light emitting device 1020 from external environment. The resin layer 1040 may be formed of an achromatic, transparent polymer resin material, such as epoxy or silicone. The resin layer 1040 may contain a fluorescent material to change the wavelength of light emitted from the light emitting device 1020.

In this embodiment, a plurality of light emitting device packages may be disposed on a board. An optical member, such as a light guide plate, a prism sheet, or a diffusion sheet, may be disposed on an optical path of the light emitting device package.

In other embodiments, a display apparatus, indication apparatus and lighting system including the light emitting device or the light emitting device package according to one of the previous embodiments may be realized. For example, the lighting system may include a lamp and a streetlight.

Figure 11:
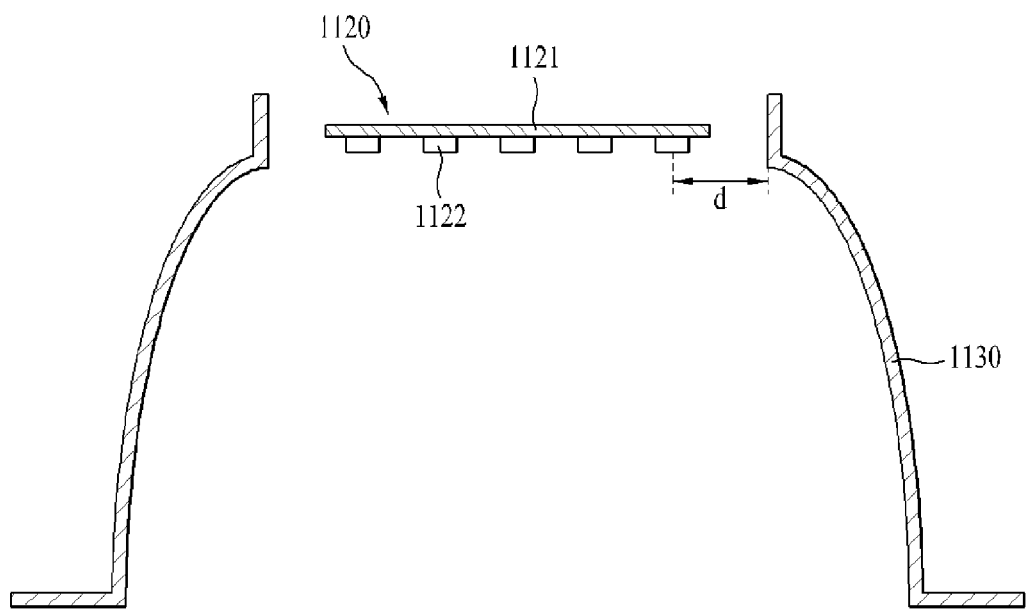
FIG. 11 is a view showing a lighting system having a light emitting module according to an embodiment.

FIG. 11 is a view showing a lighting system having a light emitting module according to an embodiment.

The lighting system may include a light emitting module 1120 and a light guide 1130 to adjust an orientation angle of light emitted from the light emitting module 1120.

The light emitting module 1120 may include at least one light emitting device 1122 (or at least one light emitting device package) provided on a printed circuit board (PCB) 1121. The light emitting device 1122 may be one of the light emitting devices 100 to 800 shown in FIGS. 1 to 8 or the light emitting device package 1000 shown in FIG. 10. A plurality of light emitting devices 1122 may be disposed on the PCB 1121 at intervals. Each of the light emitting devices may be, for example, a light emitting diode (LED).

The light guide 1130 focuses light emitted from the light emitting module 1120 so that the light is emitted through an opening with a predetermined orientation angle. The light guide 1130 may have a mirror surface formed at the inner side thereof. The light emitting module 1120 and the light guide 1130 may be spaced from each other by a predetermined distance d.

As described above, the lighting system may be used as a lighting lamp to emit light through a plurality of light emitting devices 1122, especially as a buried lamp (down light) which is buried in the ceiling or wall of a building so that the opening of the light guide 1130 is exposed.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device, comprising:
    a substrate;
    a first conductive type semiconductor layer disposed on the substrate;
    an active layer disposed on one portion of the first conductive type semiconductor layer;
    a second conductive type semiconductor layer disposed on the active layer;
    a first electrode disposed on the second conductive type semiconductor layer; and
    a second electrode disposed on an upper surface of a mesa-etched other portion of the first conductive type semiconductor layer,
    wherein a trench is formed in the first conductive type semiconductor layer and extends laterally in a sideward direction from the upper surface of the mesa-etched other portion of the first conductive type semiconductor layer on which the second electrode is disposed, the opening of the trench facing the second electrode.

2. The light emitting device according to claim 1, wherein the trench is disposed adjacent to the second electrode.

3. The light emitting device according to claim 1, wherein a height from the upper surface of the mesa-etched other portion of the first conductive type semiconductor layer opposite to the substrate to the trench is 30% to 80% of a total thickness of the first conductive type semiconductor layer.

4. The light emitting device according to claim 1, wherein the trench has a thickness equivalent to 0.25% to 25% of a total thickness of the first conductive type semiconductor layer.

5. The light emitting device according to claim 1, further comprising a reflective layer disposed between the substrate and the first conductive type semiconductor layer.

6. The light emitting device according to claim 1, further comprising an electron blocking layer disposed between the active layer and the second conductive type semiconductor layer.

7. The light emitting device according to claim 1, wherein a distance from the substrate to an upper surface of the first electrode differs from a distance from the substrate to an upper surface of the second electrode.

8. The light emitting device according to claim 1, wherein a height from the upper surface of the mesa-etched other portion of the first conductive type semiconductor layer opposite to the substrate to the trench is 1 μm to 2 μm.

9. The light emitting device according to claim 1, wherein the trench has a width of 20 μm to 40 μm.

10. The light emitting device according to claim 1, wherein the trench has a thickness of 50 Å to 10000 Å.

11. The light emitting device according to claim 1, wherein the trench has roughness formed at a surface thereof.

12. A light emitting device, comprising:
a substrate;
a first conductive type semiconductor layer disposed on the substrate;
an active layer disposed on one portion of the first conductive type semiconductor layer;
a second conductive type semiconductor layer disposed on the active layer;
a light transmitting conductive layer disposed on the second conductive type semiconductor layer;
a first electrode disposed on the light transmitting conductive layer; and
a second electrode disposed on an upper surface of a mesa-etched other portion of the first conductive type semiconductor layer,
wherein a trench is formed in the first conductive type semiconductor layer and extends laterally in a sideward direction from the upper surface of the mesa-etched other portion of the first conductive type semiconductor layer on which the second electrode is disposed, the opening of the trench facing the second electrode.

13. The light emitting device according to claim 12, wherein the light transmitting conductive layer is disposed to expose a portion of an upper surface of the second conductive type semiconductor layer, and the first electrode is disposed on the exposed portion of the second conductive type semiconductor layer and on an upper portion of the light transmitting conductive layer.

14. The light emitting device according to claim 12, wherein the light transmitting conductive layer is formed of at least one selected from among indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO) and gallium zinc oxide (GZO).

15. The light emitting device according to claim 12, further comprising an insulation layer disposed between the first electrode and the second conductive type semiconductor layer.

16. The light emitting device according to claim 15, further comprising a passivation layer to cover at least one selected from among the first conductive type semiconductor layer, the active layer, the second conductive type semiconductor layer, the light transmitting conductive layer, the first electrode and the second electrode.

17. The light emitting device according to claim 12, wherein the trench is disposed adjacent to the second electrode.

18. The light emitting device according to claim 1, wherein the sideward direction is perpendicular to a direction in which the first conductive type semiconductor layer, the active layer, and the second conductive type semiconductor layer are stacked.

19. The light emitting device according to claim 12, wherein the sideward direction is perpendicular to a direction in which the first conductive type semiconductor layer, the active layer, and the second conductive type semiconductor layer are stacked.

20. The light emitting device according to claim 1, wherein the trench has a width equivalent to 20% to 40% of a total width of the second conductive type semiconductor layer.

* * * * *